United States Patent
Simpson (10) Patent No.: US 10,499,536 B1
(45) Date of Patent: Dec. 3, 2019

(54) CONNECTOR SUPPORT ASSEMBLY WITH AIR CHANNELING

(71) Applicant: TE CONNECTIVITY CORPORATION, Berwyn, PA (US)

(72) Inventor: Jeffrey Stewart Simpson, Mechanicsburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/997,311

(22) Filed: Jun. 4, 2018

(51) Int. Cl.
*H05K 7/20* (2006.01)
*H01R 13/518* (2006.01)

(52) U.S. Cl.
CPC ....... *H05K 7/20145* (2013.01); *H01R 13/518* (2013.01); *H05K 7/20718* (2013.01)

(58) Field of Classification Search
CPC .... H05K 7/1491; H05K 7/20736; H05K 7/20; H05K 7/20127; H05K 7/20136; H05K 7/20145; H05K 7/20163; H05K 7/2039; H05K 7/20536; H05K 7/20545
See application file for complete search history.

(56) References Cited

U.S. PATENT DOCUMENTS

| | | | | |
|---|---|---|---|---|
| 8,613,632 B1* | 12/2013 | Nichols | .............. | H01R 13/6587 439/485 |
| 9,312,637 B2* | 4/2016 | Simpson | ................ | H01R 12/91 |
| 9,412,496 B2* | 8/2016 | Ritter | ................... | H01B 7/2813 |
| 9,485,890 B2 | 11/2016 | Lehman et al. | | |
| 9,509,092 B2* | 11/2016 | Shen | ................ | H01R 13/62994 |
| 9,727,079 B2* | 8/2017 | Lieber | ..................... | G06F 1/187 |
| 9,730,357 B2* | 8/2017 | Simpson | .............. | H05K 7/1492 |
| 9,793,648 B2* | 10/2017 | Regnier | ............. | H05K 7/20509 |
| 9,949,412 B2* | 4/2018 | Campbell | .......... | H05K 7/20836 |
| 10,153,571 B2* | 12/2018 | Kachlic | ................ | H01R 12/712 |
| 2012/0058670 A1* | 3/2012 | Regnier | ............. | H01R 13/6586 439/485 |
| 2018/0054922 A1* | 2/2018 | Leigh | .................... | H05K 7/1445 |
| 2019/0200487 A1* | 6/2019 | Coteus | ............... | H05K 7/20727 |

* cited by examiner

*Primary Examiner* — James Harvey
*Assistant Examiner* — Matthew T Dzierzynski (57) ABSTRACT

A connector support assembly includes an enclosure, first and second electrical connectors, and a spacer. The enclosure includes a first panel and a second panel spaced apart from each other to define a cavity therebetween. The first and second connectors are at a front end of the enclosure and at least partially in the cavity. The spacer is interposed between the first and second electrical connectors and mechanically coupled to both the first and second panels. The spacer defines a flow channel therethrough that extends from an inlet of the spacer located at the front end of the enclosure. The flow channel of the spacer is fluidly connected to a window defined through the first panel to provide unimpeded flow through the front end of the enclosure that enters the cavity through the inlet of the spacer and exits the cavity through the window.

18 Claims, 7 Drawing Sheets

CONNECTOR SUPPORT ASSEMBLY WITH AIR CHANNELING

BACKGROUND OF THE INVENTION

The subject matter herein relates generally to electrical systems that have support assemblies for holding electrical connectors in place within the electrical systems.

Electrical communication systems, such as network systems, servers, data centers, and the like, include a multitude of electrical connectors and devices arranged at different locations within the communication system. For example, electrical connectors may be arranged as midplane assemblies and backplane assemblies within the system to interconnect daughtercards, line cards, switch cards, and the like. To provide high speed and high density data transfer within the electrical communication system, some of the electrical connectors may be cable-mounted connectors that convey data through lengths of cables.

Thermal management of electrical communication systems is problematic, especially as the amount of data transferred and transfer speeds increase. For example, fans or other air movers may be installed to provide air flow through the electrical communication system to dissipate heat generated by the electrical devices. But, the multitude of electrical devices, connectors, support structures, and cables within the system may block and/or restrict air flow. Due to obstructions that block air flowing front to back through the electrical communication system, electrical devices such as processors (e.g., central processing units (CPUs)) located at a back of the electrical communication system may not receive sufficient air flow to dissipate generate heat, resulting in overheating and degraded operation of the electrical devices.

A need remains for a connector support assembly that enables unimpeded air flow through the connector support assembly to reduce air flow obstructions within an electrical communication system.

BRIEF DESCRIPTION OF THE INVENTION

In at least one embodiment, a connector support assembly is provided that includes an enclosure, first and second electrical connectors, and a spacer. The enclosure has a front end. The enclosure includes a first panel and a second panel spaced apart from each other to define a cavity therebetween. The first panel defines a window therethrough. The first and second electrical connectors are aligned in a row at the front end of the enclosure and are at least partially disposed in the cavity. The spacer is interposed between the first and second electrical connectors and mechanically coupled to both the first panel and the second panel. The spacer defines a flow channel therethrough that extends from an inlet of the spacer located at the front end of the enclosure. The flow channel of the spacer is fluidly connected to the window of the first panel to provide unimpeded flow through the front end of the enclosure that enters the cavity through the inlet of the spacer and exits the cavity through the window.

In at least one embodiment, a connector support assembly is provided that includes an enclosure and multiple spacers. The enclosure has a front end and a rear end opposite the front end. The enclosure includes a first panel and a second panel spaced apart from each other to define a cavity therebetween. The first panel defines one or more windows therethrough. The spacers are mechanically coupled to both the first panel and the second panel and are located at least partially within the cavity at the front end of the enclosure. The spacers are spaced apart from each other along a row to define at least one pocket between adjacent spacers to accommodate an electrical connector therein. The spacers include inlets at the front end of the enclosure. Each of the spacers defines a flow channel from the respective inlet through the spacer to the one or more windows of the first panel to provide unimpeded flow entering the cavity through the front end and exiting the cavity through the one or more windows in the first panel.

In at least one embodiment, a connector support assembly is provided that includes an enclosure and a spacer. The enclosure has a front end and a rear end opposite the front end. The enclosure includes a first panel and a second panel spaced apart from each other to define a cavity therebetween. Each of the first and second panels includes a front segment that extends to the front end, a rear segment that extends to the rear end, and a jogged segment between the front and rear segments. Each of the first and second panels defines a respective window therethrough along the jogged segment thereof. The spacer is mechanically coupled to both the first panel and the second panel and is located at least partially within the cavity at the front end of the enclosure. The spacer defines one or more flow channels therethrough that extend from an inlet of the spacer located at the front end of the enclosure. The one or more flow channels of the spacer are fluidly connected to the window of the first panel and the window of the second panel to provide unimpeded flow through the front end of the enclosure.

DETAILED DESCRIPTION OF THE INVENTION

Embodiments of the present disclosure provide a connector support assembly with two panels that hold one or more electrical connectors between the two panels in a row, and spacers disposed between adjacent connectors in the row. The connector support assembly is configured to provide air channeling through the connector support assembly such that not all air flow is forced around an outside of the connector support assembly. The electrical connectors and spacers are mounted at a front end of the connector support assembly. The spacers are at least partially hollow and provide air channels that receive air flow at the front end and direct the air flow through the spacers (between the two panels) before the air is discharged through one or more windows defined through one or both of the panels. The air that is discharged through the one or more windows may continue flowing rearward for absorbing and dissipating heat from devices and areas behind the connector support assembly.

At least one technical effect of the connector support assembly according to the embodiments described herein is reduced air flow obstruction through a confined space in which the connector support assembly is located, such as a server rack. The connector support assembly may allow for greater air flow rates and greater air flow volume coverage within the confined space relative to known connector assemblies because at least some of the air is able to flow through a portion of the connector support assembly without being redirected around the connector support assembly. Another technical effect may be increased efficiency due to a reduced power requirement for air movers (e.g., fans) which do not have to work as hard to move air through the confined space with the reduction in the air flow obstructions. Yet another technical effect may be increase operational output and/or efficiency by the electrical devices in the confined space due to enhanced heat dissipation attributable to increased air flow through the confined space.

Figure 1:
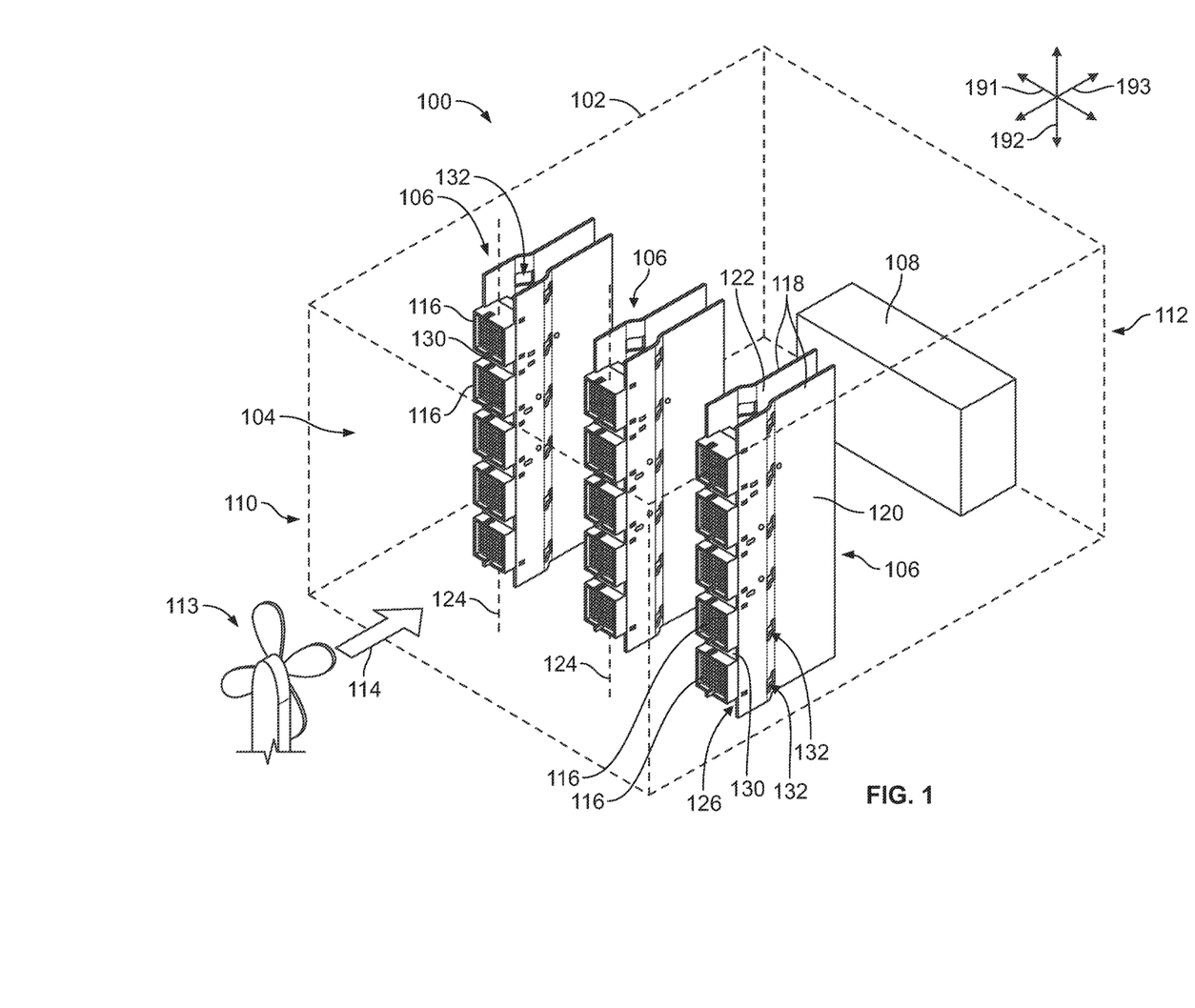
FIG. 1 illustrates an electrical communication system according to an embodiment.

FIG. 1 illustrates an electrical communication system 100 according to an embodiment. The electrical communication system 100 includes a housing 102 that defines a confined space 104. The electrical communication system 100 includes various electrical devices, connectors, cables, circuit boards, and/or the like, within the housing 102. In the illustrated embodiment, three connector support assemblies 106 are shown and a processing unit 108, although the electrical communication system 100 may include additional components and more or less than three connector support assemblies 106 in other embodiments. The processing unit 108 may include or represent one or more processors, electrical storage devices, associated circuitry, and/or the like. For example, the processing unit 108 may include one or more CPUs. The processing unit 108 is generically depicted as a box in FIG. 1, but may have another shape or shapes in other embodiments.

The housing 102 has a front 110 and a rear 112 that is opposite the front 110. A fan 113 is disposed in front of the front 110 of the housing 102, and is configured to generate air flow in a rearward direction into the confined space 104 of the housing 102. The processing unit 108 is located at the rear 112 of the housing 102. The connector support assemblies 106 are disposed in front of the processing unit 108, such that the connector support assemblies 106 are between the fan 113 and the processing unit 108 in the direction 114 of air flow. As used herein, relative or spatial terms such as "front," "back" "rear", "upper," "lower," "interior," and "exterior," are only used to identify and distinguish the referenced elements in the illustrated orientations and do not necessarily require particular positions or orientations relative to gravity and/or the surrounding environment of the electrical communication system 100.

Each of the connector support assemblies 106 includes a plurality of electrical connectors 116 held within a respective enclosure 118. The enclosures 118 are defined by a respective first panel 120 and a respective second panel 122. The electrical connectors 116 are held between the first and second panels 120, 122 of the respective enclosure 118. The connectors 116 in each enclosure 118 are aligned in a row 124. The connectors 116 are configured to mate to complementary mating connectors mounted on circuit boards (e.g., daughtercards, line cards, etc.), cables, or devices. The connectors 116 are held at front ends 126 of the enclosures 118. The connector support assemblies 106 also include spacers 130 that are held between the first and second panels 120, 122. The spacers 130 are interposed (or interleaved) with the connectors 116 such that the spacers 130 and the connectors 116 alternate along the row 124. In at least one embodiment, the spacers 130 are the only structural components between adjacent connectors 116 in the row 124. The spacers 130 enable positioning the connectors 116 at designated positions and with uniform spacing between adjacent connectors 116.

The electrical communication system 100 is oriented with respect to a lateral axis 191, a height axis 192, and a longitudinal axis 193. The axes 191-193 are mutually perpendicular. Although the height axis 192 appears to extend in a vertical direction parallel to gravity in FIG. 1, it is understood that the axes 191-193 are not required to have any particular orientation with respect to gravity. The connector support assemblies 106 are elongated parallel to the height axis 192 in the illustrated embodiment such that the rows 124 extend parallel to the height axis 192. The connector support assemblies 106 are laterally positioned side by side. In an alternative embodiment, the connector support assemblies 106 may have different positioning and/or orientation. For example, in one alternative embodiment the connector support assemblies 106 may be elongated parallel to the lateral axis 191, and may be vertically stacked relative to one another.

In one non-limiting example embodiment, the electrical communication system 100 is one or more servers, and the housing 102 is a server rack or a portion thereof, such as a tray of a server rack. The connector support assemblies 106 may be midplane assemblies.

In embodiments described herein, the connector support assemblies 106 are configured to provide air channeling through at least portions of the connector support assemblies 106 such that the connector support assemblies 106 pose less of an obstruction to air flow through the confined space 104 from the front 110 to the rear 112 of the housing 102. For example, the spacers 130 define flow channels 202 (shown in FIG. 2) that are open at the front ends 126 of the connector support assemblies 106. Some of the air flow that impinges upon the front ends 126 of the connector support assemblies 106 gets obstructed by the connectors 116, edges of the panels 120, 122, and/or edges of the spacers 130 and gets diverted around the outside of the connector support assemblies 106. However, a significant amount of the air flow that impinges upon the front ends 126 is channeled through the spacers 130 within the connector support assemblies 106. At least some of the air flow within the connector support assemblies 106 may be discharged from the connector support assemblies 106 through one or more windows 132 in the first panel 120 and/or the second panel 122, as described in more detail herein. The discharged air flow may continue moving rearward towards the rear 112 of the housing 102, absorbing heat generated by the processing unit 108.

The air channeling provided by the connector support assemblies 106 may reduce impediments to air flow through the confined space 104, relative to known midplane connector assemblies that do not provide air channeling. The connector support assemblies 106 may enable a greater air flow rate through the confined space 104, for a given power setting of the fan 113, than known midplane connector assemblies, such that the processing unit 108 and any other devices at the rear 112 receive greater air flow. The increased air flow may improve efficiency and/or operation of the processing unit 108 due to improved heat absorption and dissipation.

Figure 2:
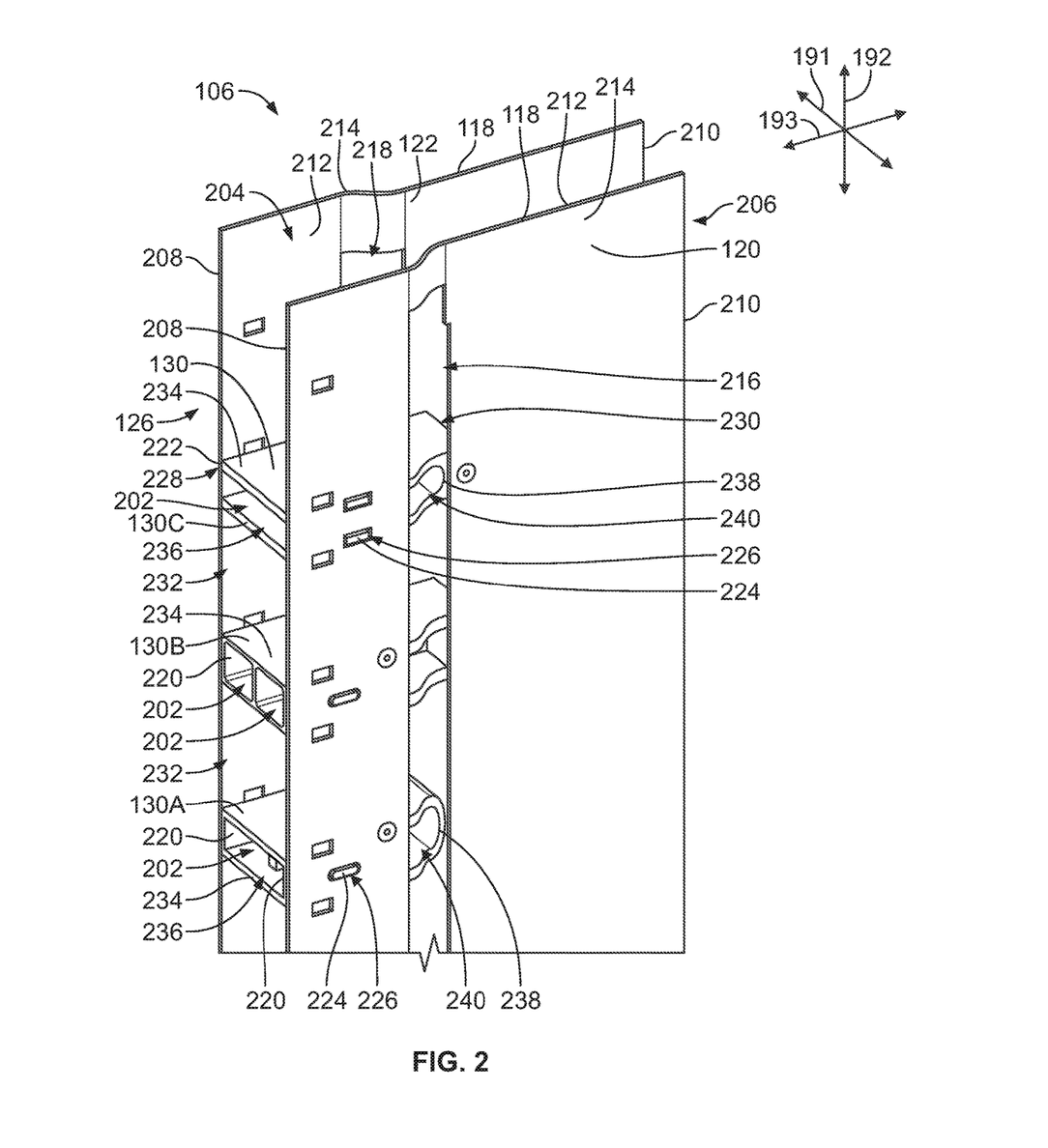
FIG. 2 is a perspective view of a portion of one connector support assembly of the electrical communication system according to an embodiment.

FIG. 2 is a perspective view of a portion of one connector support assembly 106 according to an embodiment, shown without the electrical connectors 116 (FIG. 1) of the connector support assembly 106. The first and second panels 120, 122 of the enclosure 118 are spaced apart from each other to define a cavity 204. The cavity 204 extends from the front end 126 of the enclosure 118 to a rear end 206 of the enclosure 118 opposite the front end 126. Each of the panels 120, 122 has a front edge 208 at the front end 126 and a rear edge 210 at the rear end 206. Each of the panels 120, 122 has an interior surface 212 and an exterior surface 214 opposite the interior surface 212. The interior surfaces 212 of the first and second panels 120, 122 face each other across the cavity 204 and define lateral bounds of the cavity 204.

The first panel 120 defines a window 216 through the first panel 120 (e.g., from the interior surface 212 to the exterior surface 214). In the illustrated embodiment, the window 216 is elongated parallel to the height axis 192. The window 216 intersects and extends across multiple spacers 130 of the connector support assembly 106. In the illustrated embodiment, the second panel 122 defines a window 218 therethrough that is elongated parallel to the height axis 192 and parallel to the window 216, such that the window 218 intersects multiple spacers 130.

Optionally, the second panel 122 may be a duplicate of the first panel 120. As used herein, the term "duplicate" means that the first and second panels 120, 122 have the same size and shape as one another, and the same features and cutouts. For example, the first and second panels 120, 122 may be replicas or copies of each other that are produced using the same instruments, tools, machines, molds, conditions, processes, and/or the like. It is recognized that two duplicate components may not be exactly identical to one another due to production inconsistencies, blemishes, post-production deformations and/or abrasions, and the like. The duplicate first and second panels 120, 122 may be oriented such that the second panel 122 mirrors the first panel 120 across the cavity 204. The panels 120, 122 may be stamped and formed. The panels 120, 122 may be composed of a metal material, such as sheet metal.

In one or more alternative embodiments, the second panel 122 may differ from the first panel 120. For example, in one alternative embodiment, the second panel 122 does not include the window 218 or the first panel 120 does not include the window 216 such that only one of the panels 120, 122 defines one or more windows for discharging air flow out of the cavity 204. In another alternative embodiment, instead of having elongated windows 216, 218 that intersect multiple spacers 130, each of the panels 120, 122 may define multiple windows that are spaced apart from each other along the height axis 192, where each window of a given panel aligns with a different corresponding spacer 130, as shown in the embodiment depicted in FIG. 1.

The spacers 130 are mechanically coupled to the first and second panels 120, 122. Each spacer 130 extends across the cavity 204 from the first panel 120 to the second panel 122. The spacers 130 have panel walls 220 or panel edges 222 that engage the interior surfaces 212 of the panels 120, 122. In the illustrated embodiment, the spacers 130 have tabs 224 protruding from the panel walls 220 or the panel edges 222. The tabs 224 are received in apertures 226 defined in the panels 120, 122 to mount the spacers 130 to the enclosure 118. In an alternative embodiment, the panels 120, 122 may have tabs or other protrusions that extend into the cavity 204 and engage the spacers 130. In another alternative embodiment, adhesive and/or fasteners (e.g., screws, bolts, or the like) may be used to mount the spacers 130 to the panels 120, 122.

The spacers 130 have front ends 228 and rear ends 230 that are opposite the front ends 228. In the illustrated embodiment, the front ends 228 of the spacers 130 align with the front end 126 of the enclosure 118 (e.g., at the front edges 208 of the panels 120, 122). Alternatively, the front ends 228 of the spacers 130 may be offset from the front end 126 of the enclosure 118. The spacers 130 are not as long as the panels 120, 122 along the longitudinal axis 193, so the rear ends 230 of the spacers 130 are spaced apart from the rear end 206 of the enclosure 118. Optionally, the spacers 130 may be less than half the length of the enclosure 118 such that the rear ends 230 of the spacers 130 are located closer to the front end 126 of the enclosure 118 than the rear end 206.

The enclosure 118 and the spacers 130 define pockets 232 that accommodate the electrical connectors 116. Each pocket 232 extends vertically along the height axis 192 between two adjacent spacers 130. Each pocket 232 extends laterally along the lateral axis 191 between the first and second panels 120, 122. The spacers 130 include connector walls 234 that define bounds of the pockets 232. For example, the connector walls 234 face the connectors 116 that are received in the pockets 232. Each connector wall 234 extends laterally across the cavity 204 from the first panel 120 to the second panel 122. The connector walls 234 are connected with the panel walls 220 of the spacers 130 and/or define the panel edges 222 of the spacers 130, depending on the specific spacer design as described herein. The connector walls 234 may be configured to directly mechanically engage the connectors 116. Alternatively, the connector walls 234 of the spacers 130 may be spaced apart from the connectors 116 via a structural insert, such as a gasket or seal, or via an air gap to provide clearance or tolerance.

The spacers 130 are at least partially hollow and define flow channels 202 therethrough. The spacers 130 have inlets 236 at the front ends 228 of the spacers 130. The inlets 236 are openings exposed at the front end 126 of the enclosure 118 to receive air flow into the cavity 204 via the spacers 130. The flow channels 202 of the spacers 130 are fluidly connected to both the window 216 of the first panel 120 and the window 218 of the second panel 122. For example, the air flow within the flow channels 202 of the spacers 130 gets discharged from the connector support assembly 106 through the windows 216, 218 of the panels 120, 122.

The spacers 130 may be designed to prohibit or eliminate air flow in the cavity 204 rearward of the windows 216, 218. For example, the spacers 130 may have back walls 238 at the rear ends 230 that block rearward air flow. The back walls 238 force air to flow outward towards the windows 216, 218 in the panels 120, 122. The spacers 130 include outlets 240 that are fluidly connected to the windows 216, 218. The air within the flow channels 202 exits the spacers 130 through the outlets 240. The outlets 240 are located at the windows 216, 218 of the panels 120, 122. The air discharged through the windows 216, 218 may flow rearward generally along the exterior surfaces 214 of the panels 120, 122 until passing beyond the rear end 206 of the enclosure 118.

The spacers 130 in the illustrated embodiment have slightly different shapes and features from one another, as described in more detail herein. For example, the spacers 130 include a first spacer 130A, a second spacer 130B, and a third spacer 130C that have different shapes and features from one another. In one or more embodiments, all of the spacers 130 in the same connector support assembly 106 may be duplicates or replicas of each other such that the spacers 130 all have the same shapes and features. For example, all of the spacers 130 may be duplicates of the first spacer 130A, duplicates of the second spacer 130B, duplicates of the third spacer 130C, or duplicates of another spacer embodiment. Utilizing duplicate spacers 130 in the connector support assembly 106 may conserve costs by reducing the number of unique components. The spacers 130 according to different design embodiments may have a single flow channel 202 or two flow channels 202.

Figure 3:
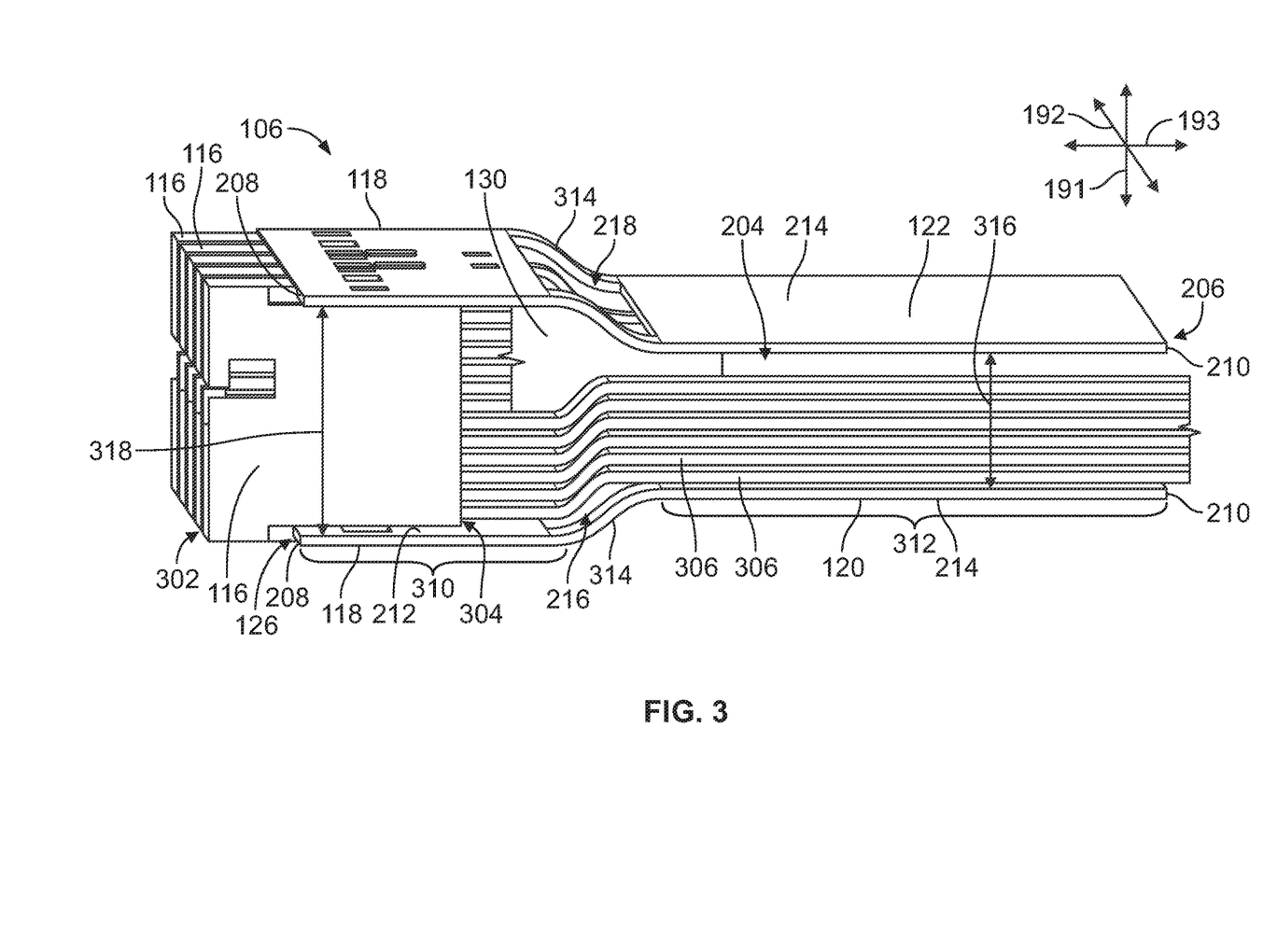
FIG. 3 is a top-down perspective view of the connector support assembly according to the embodiment shown in FIG. 2.

FIG. 3 is a top-down perspective view of the connector support assembly 106 according to the embodiment shown in FIG. 2. FIG. 3 prominently shows one of the electrical connectors 116 at an end of the row 124 (shown in FIG. 1), and shows small portions of other electrical connectors 116. The connectors 116 have mating ends 302 and cable ends 304. The connectors 116 are mounted to the enclosure 118 at the front end 126 and are held at least partially in the cavity 204. The mating ends 302 optionally project forward beyond the front end 126 (e.g., beyond the front edges 208 of the first and second panels 120, 122). The connectors 116 may engage the interior surfaces 212 of the panels 120, 122. The connectors 116 may be mounted to the panels 120, 122 via fasteners (e.g., screws, bolts, etc.) through apertures in the panels 120, 122, via tabs or other protrusions, via interference fits, and/or the like.

In at least one embodiment, the electrical connectors 116 are cable-mounted such that cables 306 protrude rearward from the cable ends 304. The connector 116 at the end has a plurality of cables 306, but only about half of the cables 306 are depicted for descriptive purposes to show a portion of a spacer 130 adjacent to the connector 116. The cables 306 extend rearward beyond the rear end 206 of the enclosure 118 for electrically connecting to one or more devices, circuit boards, or the like.

In at least one embodiment, the first and second panels 120, 122 are contoured. Each of the panels 120, 122 has a front segment 310 extending to the respective front edge 208 (at the front end 126 of the enclosure 118), a rear segment 312 extending to the respective rear edge 210 (at the rear end 206), and a jogged segment 314 therebetween. The rear segments 312 of the two panels 120, 122 are spaced apart from each other to define a narrow diameter region 316 of the cavity 204. The jogged segments 314 of the panels 120, 122 are stepped to extend from the respective rear segments 312 laterally outward away from each other. The front segments 310 of the two panels 120, 122 are farther apart from one another than the rear segments 312, and the front segments 310 define a wide diameter region 318 of the cavity 204. The wide diameter region 318 has a greater lateral width between the panels 120, 122 than the narrow diameter region 316. The connectors 116 and the spacers 130 are mounted within the wide diameter region 318. The spacers 130 extend beyond the wide diameter region 318 into an intermediate region defined between the jogged segments 314 of the panels 120, 122. The narrow diameter region 316 is occupied by the cables 306 of the connectors 116.

In at least one embodiment, the window 216 of the first panel 120 is located along the jogged segment 314 thereof, and the window 218 of the second panel 122 is located along the jogged segment 314 thereof. Optionally, the windows 216, 218 may longitudinally extend beyond the jogged segment 314 into the front segment 310 and/or the rear segment 312. Due to the contoured jogs in the panels 120, 122 at the locations of the windows 216, 218, air flow along the wide diameter region 318 of the cavity 204 (e.g., between the two panels 120, 122) is ejected from the cavity 204 and subsequently flows along the exterior surfaces 214 of the panels 120, 122 without impeding the flow. Thus, the connector support assembly 106 provides unimpeded air flow through the front end 126 of the enclosure 118.

Because the air flowing rearward within the cavity 204 is discharged through the windows 216, 218 along the jogged segments 314, little or no air may flow into the narrow diameter region 316 of the cavity 204. As a result, air is not forced to flow through small crevices defined between cables 306, which would impede the flow of air through the connector support assembly 106.

Figure 4:
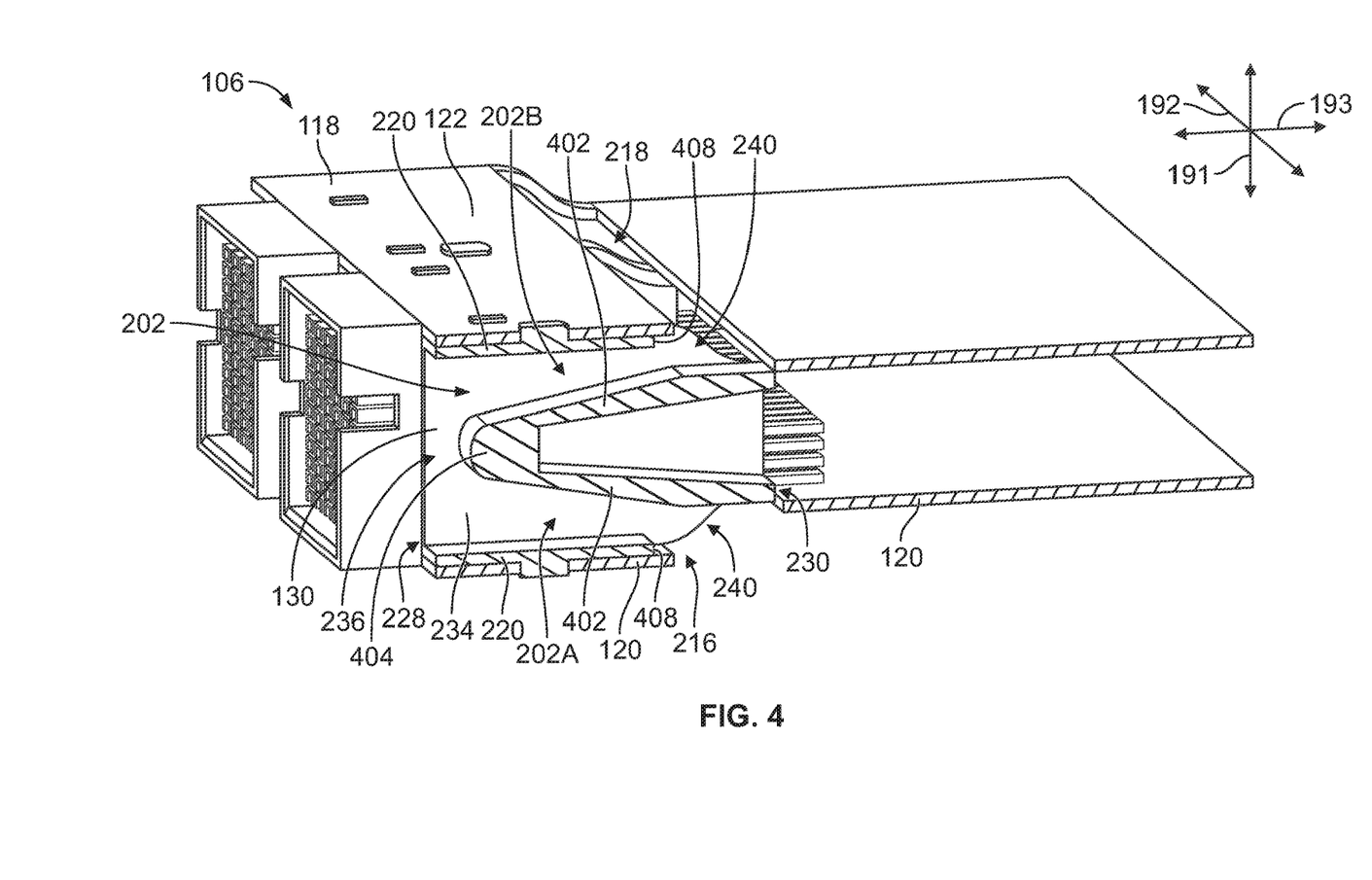
FIG. 4 is a top-down cross-sectional view of the connector support assembly according to the embodiment shown in FIG. 2.

FIG. 4 is a top-down cross-sectional view of the connector support assembly 106 according to the embodiment shown in FIG. 2. The cross-section in FIG. 4 is taken through one of the spacers 130 as well as through both panels 120, 122 of the enclosure 118. The spacer 130 in the illustrated embodiment defines two flow channels 202 extending from the inlet 236 at the front end 228 to different corresponding outlets 240. The spacer 130 shown in FIG. 4 may be the first spacer 130A shown in FIG. 2. A first flow channel 202A is fluidly connected to the window 216 of the first panel 120. A second flow channel 202B is fluidly connector to the window 218 of second panel 122. The two flow channels 202A, 202B are separated by one or more divider walls 402. The one or more divider walls 402 guide the air flow from the inlet 236 to the respective outlets 240. In the illustrated embodiment, the spacer 130 includes two divider walls 402, and the two divider walls 402 are connected to each other at a front nose 404. The divider walls 402 are angled or curved relative to the panel walls 220 such that the distance separating the two flow channels 202A, 202B gradually increases with increasing distance from the front nose 404. The divider walls 402 resemble ramp surfaces, and split the air that enters the hollow spacer 130 into two air streams.

The spacer 130 has two outlets 240 that are at or proximate to the rear end 230. The outlets 240 in the illustrated embodiment are located at opposite lateral corners of the spacer 130 at the rear end 230. For example, the outlets 240 are partially defined by rear edges 408 of the panel walls 220 of the spacer 130 and are bounded vertically along the height axis 192 by the connector walls 234 of the spacer 130. Only one connector wall 234 is visible in FIG. 4. The outlets 240 may also be at least partially defined by the divider walls 402 that extend to the rear end 230 of the spacer 130. For example, each outlet 240 may extend laterally from the rear edge 408 of one panel wall 220 to one of the divider walls 402. Each of the outlets 240 is located at a different one of the windows 216, 218.

The spacer 130 in the illustrated embodiment may be formed via a molding process. The spacer 130 may be composed of a polymer material, such as one or more plastics. Alternatively, the spacer 130 may be composed of a metal material, and may be formed via die-casting or the like.

Figure 5:
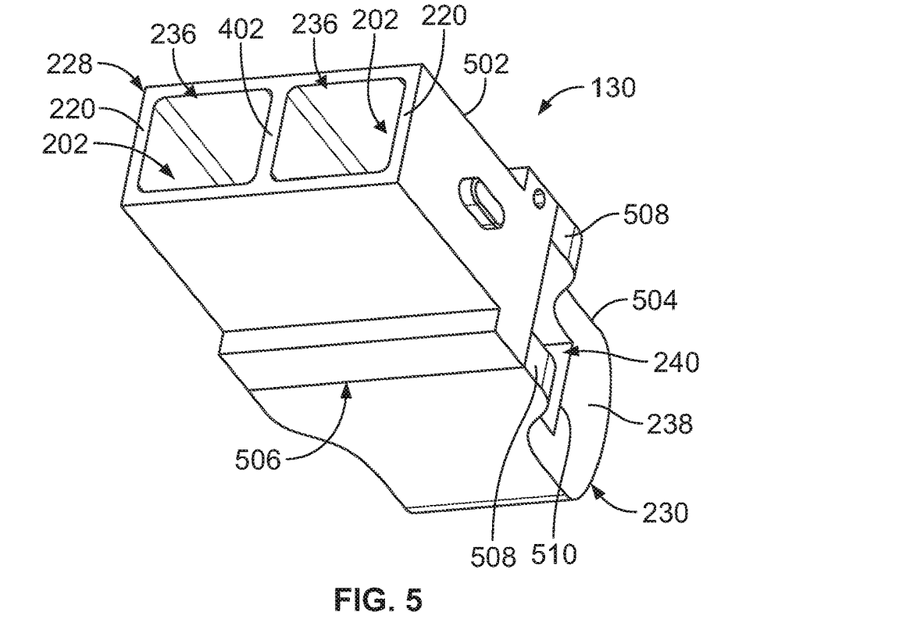
FIG. 5 is a front perspective view of one of the spacers of the connector support assembly according to the embodiment shown in FIG. 2.
Figure 6:
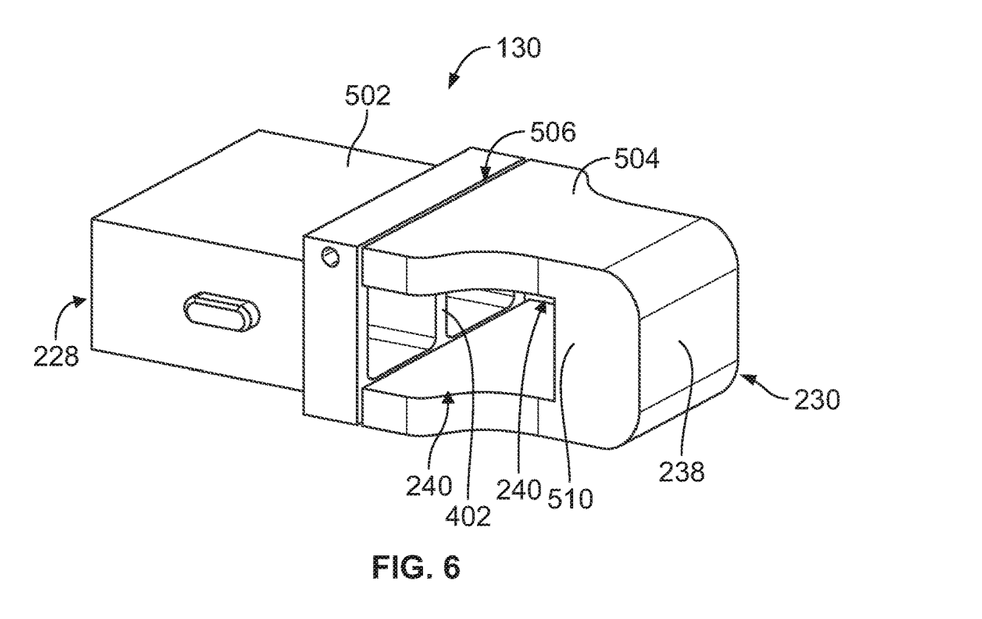
FIG. 6 is a rear perspective view of the spacer shown in FIG. 5.

FIG. 5 is a front perspective view of one of the spacers 130 of the connector support assembly 106 shown in FIG. 2. FIG. 6 is a rear perspective view of the spacer 130 shown in FIG. 5. The spacer 130 shown in FIGS. 5 and 6 may be the second spacer 130B shown in FIG. 2. The spacer 130 has a two-piece construction including front member 502 and a back member 504 that are coupled together at an interface 506. The front member 502 defines the front end 228 of the spacer 130. The front member 502 defines two flow channels 202 separated by a single divider wall 402. The divider wall 402 extends to the front end 228, such that there are two discrete inlets 236 in the spacer 130. The divider wall 402 is elongated parallel to the panel walls 220, and as a result the two flow channels 202 have uniform sizes and parallel trajectories through the front member 502.

The back member 504 has a U-shape body that includes the back wall 238 of the spacer 130 at the rear end 230 and two wings 508 extending from the back wall 238 to the front member 502. The spacer 130 defines two outlets 240 along opposite lateral outside edges 510 of the back wall 238. The two outlets 240 are fluidly connected to the corresponding windows 216, 218 of the panels 120, 122 (shown in FIG. 4).

The back member 504 optionally may be formed of a different material than the front member 502. For example, the front member 502 may be a rigid plastic or metal, and the back member 504 may be a compressible foam-like material. In an alternative embodiment, the spacer 130 may have a unitary, monolithic (e.g., one-piece) construction such that a single component has the structure provided by the front member 502 and the back member 504 in FIGS. 5 and 6.

Figure 7:
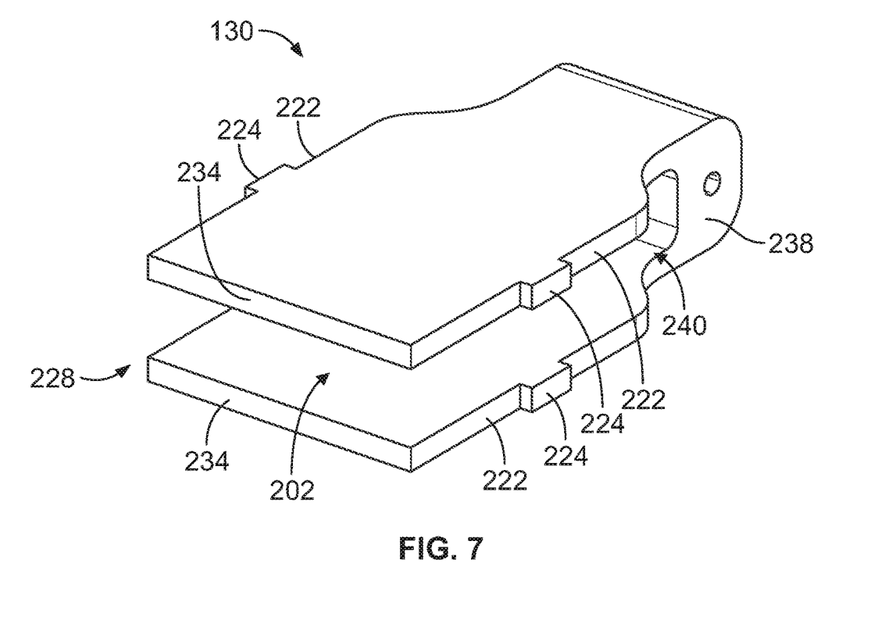
FIG. 7 is a front perspective view of another one of the spacers of the connector support assembly according to the embodiment shown in FIG. 2.
Figure 8:
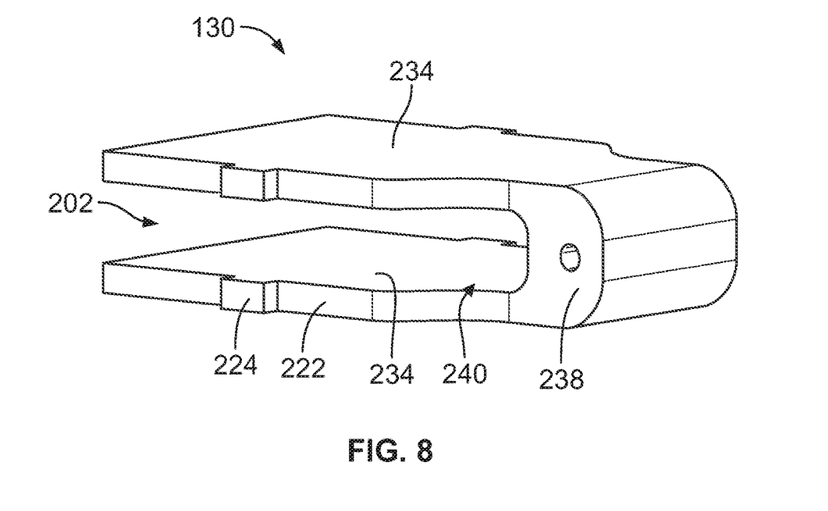
FIG. 8 is a rear perspective view of the spacer shown in FIG. 7.

FIG. 7 is a front perspective view of another one of the spacers 130 of the connector support assembly 106 shown in FIG. 2. FIG. 8 is a rear perspective view of the spacer 130 shown in FIG. 7. The spacer 130 shown in FIGS. 7 and 8 may be the third spacer 130C shown in FIG. 2. The spacer 130 has the back wall 238 and two connector walls 234 that extend from the back wall 238. The spacer 130 lacks panel walls. The connector walls 234 have panel edges 222 that engage the interior surfaces 212 of the panels 120, 122 (shown in FIG. 2). The panel edges 222 have the tabs 224 that protrude into the apertures 226 (FIG. 2) in the panels 120, 122. The spacer 130 has a simple, one-piece construction. The spacer 130 lacks a divider wall, so the spacer 130 defines a single flow channel 202 therethrough from the front end 228 to the outlets 240. Because the spacer 130 lacks panel walls, the front segments 310 (FIG. 3) of the panels 120, 122 laterally bound and enclose the flow channel 202 (and define portions of the perimeters of the outlets 240). The spacer 130 may be bent and formed out of a pliable metal material, such as sheet metal. Alternatively, the spacer 130 may be molded.

Figures 9, 10:
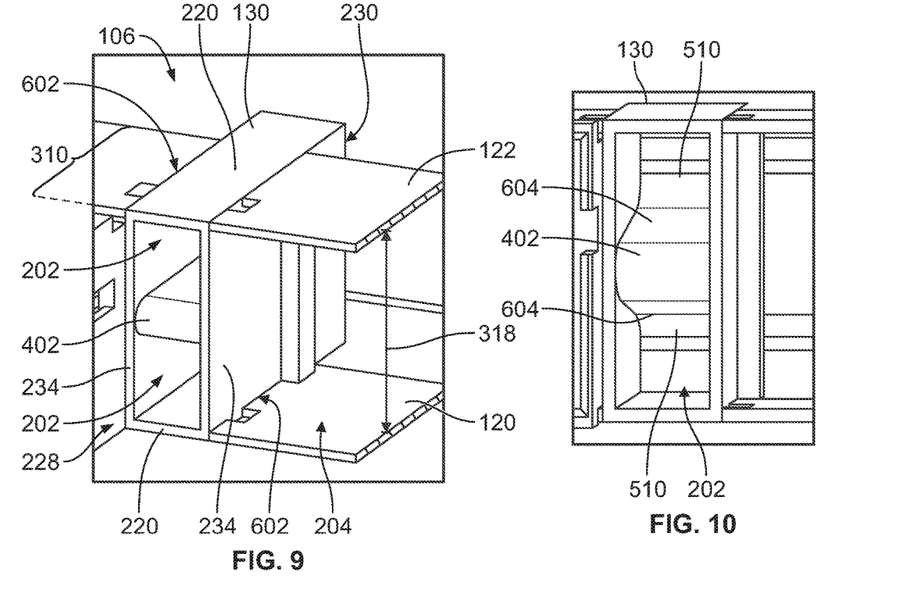
FIG. 9 is a front perspective view of a portion of the connector support assembly according to an alternative embodiment showing one of the spacers thereof.
FIG. 10 is another front perspective view showing the spacer of FIG. 9.
Figure 11:
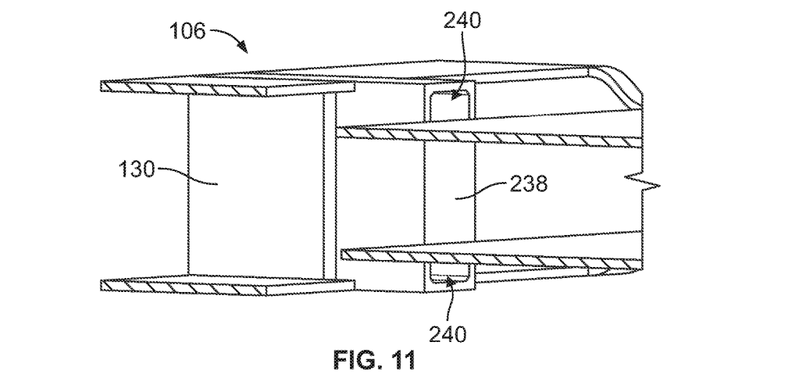
FIG. 11 is a rear perspective view of a portion of the connector support assembly shown in FIG. 9.

FIG. 9 is a front perspective view of a portion of the connector support assembly 106 according to an alternative embodiment showing one of the spacers 130 thereof. FIG. 10 is another front perspective view showing the spacer 130 of FIG. 9. FIG. 11 is a rear perspective view of a portion of the connector support assembly 106 shown in FIG. 9. The spacer 130 shown in FIGS. 9-11 may have a different shape and/or features than the spacers 130A-130C shown in FIG. 2.

In the illustrated embodiment, the spacer 130 has a wide, box-shaped body. The lateral width of the spacer 130 is greater than the wide diameter region 318 of the cavity 204. The front segments 310 of the panels 120, 122 are each segmented to define at least one slot 602 therethrough. The spacer 130 extends at least partially through the slots 602 of the panels 120, 122. The spacer 130 is box-shaped such that the panel walls 220 and the connector walls 234 all extend from the front end 228 of the spacer 130 to the rear end 230.

As show in FIG. 10, the spacer 130 has at least one divider wall 402 that provides two flow channels 202 for air flow through the hollow spacer 130. The divider wall 402 (or walls) has angled ramp surfaces 604, similar to the divider walls 402 shown in FIG. 4. The spacer 130 has two outlets 240 at the rear end 230. The outlets 240 are defined along opposite lateral outside edges 510 of the back wall 238.

The connector support assembly 106 according to the embodiments described herein is configured to provide unimpeded air flow through the front of the connector support assembly 106 to enable an increased amount of air flow to bypass the connector support assembly 106 without all of the air being redirected around the front of the connector support assembly 106. The various embodiments of the spacers 130 described herein are intended to show that the spacers 130 may have different shapes and features without departing from the scope of the inventive subject matter, as all of the spacers 130 define at least one flow channel 202 for directing air flow from the front of the connector support assembly 106 through the spacer 130 for discharge through a window of one of the panels 120, 122.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. Dimensions, types of materials, orientations of the various components, and the number and positions of the various components described herein are intended to define parameters of certain embodiments, and are by no means limiting and are merely example embodiments. Many other embodiments and modifications within the spirit and scope of the claims will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A connector support assembly comprising:
an enclosure having a front end, the enclosure including a first panel and a second panel spaced apart from each other to define a cavity therebetween, the first panel defining a window therethrough;
first and second electrical connectors aligned in a row at the front end of the enclosure and at least partially disposed in the cavity; and
a spacer interposed between the first and second electrical connectors and mechanically coupled to both the first panel and the second panel, the spacer defining a flow channel therethrough that extends from an inlet of the spacer located at the front end of the enclosure, the flow channel of the spacer fluidly connected to the window of the first panel to provide unimpeded flow through the front end of the enclosure that enters the cavity through the inlet of the spacer and exits the cavity through the window; and wherein the enclosure extends from the front end to a rear end opposite the front end, the first panel including a front segment that extends to the front end, a rear segment that extends to the rear end, and a jogged segment located between the front segment and the rear segment, wherein the window of the first panel is located along the logged segment.

2. The connector support assembly of claim 1, wherein the cavity of the enclosure has a wide diameter region at the front segment of the first panel and a narrow diameter region at the rear segment, the first and second connectors and the spacer located within the wide diameter region of the cavity, wherein the first and second connectors are mounted to cables that protrude rearward from the first and second connectors along the narrow diameter region of the cavity.

3. The connector support assembly of claim 1, wherein the first panel includes a front edge at the front end of the enclosure and a rear edge at the rear end of the enclosure, wherein the window through the first panel is spaced apart from both the front edge and the rear edge.

4. The connector support assembly of claim 1, wherein the spacer has a back wall at an opposite end of the spacer relative to the inlet, wherein the spacer defines an outlet at an outside edge of the back wall that is fluidly connected to the window of the first panel.

5. The connector support assembly of claim 1, wherein the second panel defines a window therethrough, wherein the flow channel through the spacer is also fluidly connected to the window of the second panel.

6. The connector support assembly of claim 1, wherein the second panel defines a window therethrough, wherein the flow channel through the spacer that is fluidly connected to the window of the first panel is a first flow channel and the spacer also defines a second flow channel that is fluidly connected to the window of the second panel.

7. The connector support assembly of claim 6, wherein the spacer includes at least one divider wall disposed between the first and second flow channels.

8. The connector support assembly of claim 1, further comprising additional electrical connectors aligned with the first and second connectors in the row, wherein the spacer is a first spacer of multiple spacers interposed between the electrical connectors in the row.

9. The connector support assembly of claim 8, wherein the window through the first panel is elongated and is fluidly connected to the respective flow channels of at least two of the spacers in the row.

10. The connector support assembly of claim 8, wherein the window through the first panel that is fluidly connected to the flow channel of the first spacer is a first window, and the first panel defines at least a second window therethrough that is spaced apart from the first window and fluidly connected to a flow channel of a second spacer of the multiple spacers.

11. A connector support assembly comprising:
an enclosure having a front end and a rear end opposite the front end, the enclosure including a first panel and a second panel spaced apart from each other to define a cavity therebetween, the first panel defining one or more windows therethrough; and
multiple spacers mechanically coupled to both the first panel and the second panel and located at least partially within the cavity at the front end of the enclosure, the spacers being spaced apart from each other along a row to define at least one pocket between adjacent spacers to accommodate an electrical connector therein,
wherein the spacers include inlets at the front end of the enclosure, each of the spacers defining a flow channel from the respective inlet through the spacer to the one or more windows of the first panel to provide unimpeded flow entering the cavity through the front end and exiting the cavity through one or more windows in the first panel; and wherein the first panel includes a front segment that extends to the front end, a rear segment that extends to the rear end, and a jogged segment located between the front segment and the rear segment, wherein the one or more windows of the first panel are located along the jogged segment.

12. The connector support assembly of claim 11, wherein the one or more windows includes multiple windows spaced apart from each other along a line that is parallel to the row of spacers, the windows being fluidly connected to the respective flow channels of different corresponding spacers along the row.

13. The connector support assembly of claim 11, wherein the spacers have back walls at opposite ends of the spacers relative to the inlets, the back walls of the spacers being spaced apart from the rear end of the enclosure, the back walls blocking air flow within the cavity rearward of the back walls.

14. The connector support assembly of claim 11, wherein each of the spacers defines a first outlet partially defined by a first outside edge of a respective back wall of the spacer and a second outlet partially defined by a second outside edge of the respective back wall opposite the first outside edge, wherein the first outlets of the spacers are fluidly connected to the one or more windows of the first panel and the second outlets of the spacers are fluidly connected to one or more windows defined through the second panel.

15. The connector support assembly of claim 11, wherein the second panel is a duplicate of the first panel such that the second panel also defines one or more windows therethrough, the second panel mirroring the first panel across the cavity.

16. A connector support assembly comprising:
an enclosure having a front end and a rear end opposite the front end, the enclosure including a first panel and a second panel spaced apart from each other to define a cavity therebetween, each of the first and second panels including a front segment that extends to the front end, a rear segment that extends to the rear end, and a jogged segment between the front and rear segments, each of the first and second panels defining a respective window therethrough along the jogged segment thereof; and
a spacer mechanically coupled to both the first panel and the second panel and located at least partially within the cavity at the front end of the enclosure, the spacer defining one or more flow channels therethrough that extend from an inlet of the spacer located at the front end of the enclosure, the one or more flow channels of the spacer fluidly connected to the window of the first panel and the window of the second panel to provide unimpeded flow through the front end of the enclosure.

17. The connector support assembly of claim 16, further comprising a first electrical connector and a second electrical connector located on opposite sides of the spacer at the front end of the enclosure in engagement with the spacer, the first and second electrical connectors at least partially disposed in the cavity between the first panel and the second panel.

18. The connector support assembly of claim 16, wherein the one or more flow channels of the spacer includes a first flow channel that is fluidly connected to the window of the first panel and a second flow channel that is fluidly connected to the window of the second panel, wherein the spacer includes at least one divider wall between the first and second flow channels.

\* \* \* \* \*